US006469793B1

(12) United States Patent
Stanton

(10) Patent No.: US 6,469,793 B1
(45) Date of Patent: Oct. 22, 2002

(54) MULTI-CHANNEL GRATING INTERFERENCE ALIGNMENT SENSOR

(75) Inventor: Stuart T. Stanton, Bridgewater, NJ (US)

(73) Assignee: SVG Lithography Systems, Inc., Wilton, CT (US)

(*) Notice: Subject to any disclaimer, the term of this patent is extended or adjusted under 35 U.S.C. 154(b) by 0 days.

(21) Appl. No.: 09/371,337

(22) Filed: Aug. 10, 1999

(51) Int. Cl.[7] ............................................... G01B 9/02
(52) U.S. Cl. ..................... 356/521; 356/494; 356/499
(58) Field of Search ............................. 356/488, 494, 356/499, 521

(56) References Cited

U.S. PATENT DOCUMENTS

| 4,577,968 A | * 3/1986 | Makosch ................. 356/356 |
| 4,631,416 A | 12/1986 | Trutna, Jr. |
| 4,829,193 A | 5/1989 | Nishi |
| 4,848,911 A | 7/1989 | Uchida et al. |
| 5,048,968 A | 9/1991 | Suzuki |
| 5,100,234 A | 3/1992 | Ishibashi et al. |
| 5,151,754 A | 9/1992 | Ishibashi et al. |
| 5,171,999 A | * 12/1992 | Komatsu et al. ............ 250/548 |
| 5,402,230 A | 3/1995 | Tian et al. |
| 5,559,601 A | 9/1996 | Gallatin et al. |

OTHER PUBLICATIONS

Press Release of ASM Lithography dated Mar. 16, 1999 (2 pages); Introducing ATHENA.

* cited by examiner

Primary Examiner—Frank G. Font
Assistant Examiner—Andrew H. Lee
(74) Attorney, Agent, or Firm—Fattibene & Fattibene; Paul A. Fattibene; Arthur T. Fattibene

(57) ABSTRACT

An alignment sensor having a fixed reference grating and a movable wafer grating receiving electromagnetic radiation from a coherent illumination source. The illumination source is split into two beams by a beamsplitter. One beam is directed to a fixed reference grating and the diffracted orders are collected. The other beam from the beamsplitter is directed to a movable wafer grating. The diffracted orders from the movable wafer grating are collected and caused to interfere with the diffracted orders from the fixed reference grating, causing a phase shift indicative of the wafer movement or misalignment with respect to the fixed reference grating. Multiple channels having discrete wavelengths or colors are used to optimize detection and alignment irrespective of wafer processing variables. A polarization fixture on the illumination source and a central polarizing portion on the beamsplitter is used to provide contrast optimization, or alternately a latent image metrology mode. The alignment sensor improves alignment accuracy irrespective of processing variables and provides flexibility improving efficiency in the manufacture of semiconductor devices.

19 Claims, 4 Drawing Sheets

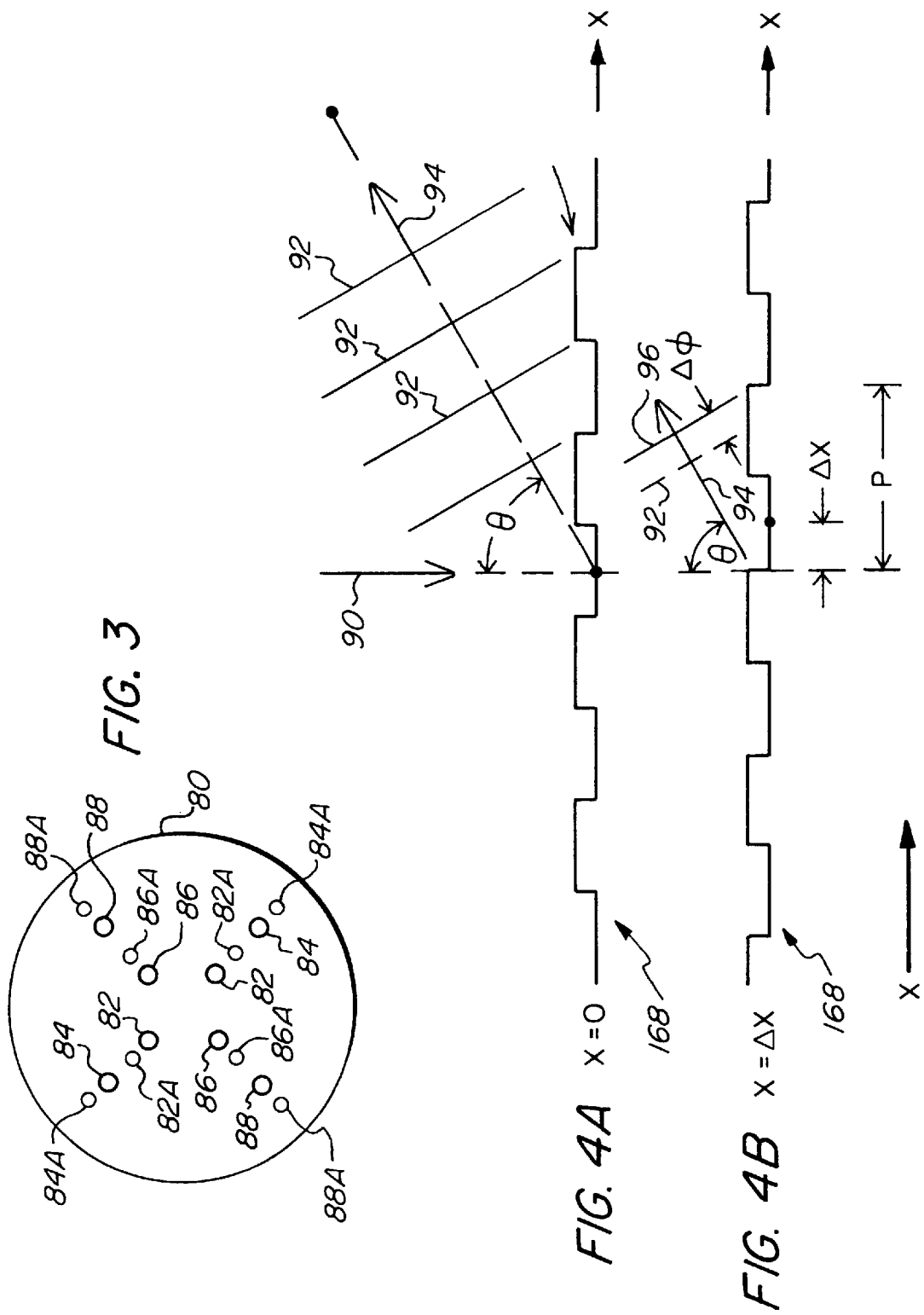

MULTI-CHANNEL GRATING INTERFERENCE ALIGNMENT SENSOR

FIELD OF THE INVENTION

The present invention relates in general to a device for accurately aligning or positioning an object, and more particularly to the alignment of a mask and a wafer as used in photolithography in the manufacture of semiconductor devices.

BACKGROUND OF THE INVENTION

In the manufacture of semiconductor devices, multiple processing steps are often required for producing a single wafer. The image of a mask is projected onto a wafer and the wafer is processed multiple times in fabricating a variety of layers to produce a semiconductor device, such as a microprocessor. In processing a wafer, accurate positioning and alignment of the wafer with a mask or reticle to be imaged thereon is often critical.

While there are many alignment sensors that use diffraction gratings, these alignment sensors tend to image a diffraction grating on a mask onto a diffraction grating on a wafer in order to detect alignment. One such alignment system is disclosed in U.S. Pat. No. 4,631,416 entitled "Wafer/Mask Alignment System Using Diffraction Gratings" issuing to Trutna, Jr. on Dec. 23, 1996, which is herein incorporated by reference. Therein disclosed is an alignment sensor and method with light diffracted from a mask grating to a wafer grating and back through the mask grating to produce diffraction orders. The intensity of the zero order is detected, and alignment occurs when the intensity of the zero order is at an extremum. A holographic phase grating is used on the mask too simplify W production of the grating. Another alignment system using gratings is disclosed in U.S. Pat. No. 4,848,911 entitled "Method for Aligning First and Second Objects, Relative to Each Other, and Apparatus for Practicing This Method" issuing to Uchida et al on Jul. 18, 1989, which is herein incorporated by reference. Therein disclosed is an apparatus and method for aligning a mask and a wafer. A first one-dimensional diffraction grating is formed on the mask and a second diffraction grating having a checkerboard like pattern, is formed on the wafer. Light beams diffracted from the first diffraction grating on the mask are transferred to the second diffraction grating on the wafer. The diffracted light beams from the second diffraction grating on the wafer are transferred to the first diffraction grating on the mask, and again diffracted by the first diffraction grating on the mask. The mask and wafer are precisely in line relative to each other in accordance with the intensity of the detected diffracted light beam. Another alignment system using diffraction gratings is disclosed in U.S. Pat. No. 5,100,234 entitled "Method and Apparatus for Aligning Two Objects, and Method and Apparatus for Providing A Desired Gap Between Two Objects" issuing to Ishibashi et al on Mar. 31, 1992, which is herein incorporated by reference. Therein disclosed is a first diffraction grating formed on a mask and a second diffraction grating formed on a wafer. Two light beams having slightly different frequencies interfere with each other and are diffracted by the first and second diffraction gratings. The diffracted light beams are combined into a detection light beam which has a phase shift representing the displacement between the wafer and the mask, or a phase shift representing the gap between the wafer and the mask. Another alignment system is disclosed in U.S. Pat. No. 5,151,754 entitled "Method And An Apparatus For Measuring A Displacement Between Two Objects And A Method and Apparatus For Measuring A Gap Distance Between Two Objects" issuing to Ishibashi et al on Nov. 29, 1992, which is herein incorporated by reference. Two objects, such as a mask and a wafer, each have at least one diffraction grating thereon. Two light beams of different frequencies are diffracted by the diffraction gratings. A light beam of a specific order is detected from each of the diffracted interference light beams and is converted into a beat signal. The displacement is obtained in accordance with the phase difference between these beat signals. Another alignment sensor or position detection apparatus is disclosed in U.S. Pat. No. 5,171,999 entitled "Adjustable Beam And Interference Fringe Position" issuing to Komatsu et al on Dec. 15, 1992, herein incorporated by reference. Therein disclosed is a position detection apparatus or alignment sensor that has a diffraction grating on a substrate and an alignment optical system for illuminating the diffraction grating with a pair of coherent light beams having different frequencies and different directions. Yet another alignment sensor is disclosed in U.S. Pat. No. 5,559,601 entitled "Mask And Wafer Diffraction Grating Alignment System Wherein The Diffracted Light Beams Return Substantially Along An Incident Angle" issuing to Gallatin et al on Sep. 24, 1996, which is herein incorporated by reference. Therein disclosed is a grating-grating interferometric wafer alignment system having a diffraction grating on a mask and a diffraction grating on a wafer. A diffraction order is detected at a predetermined angle and the phase and amplitude of a known frequency component of the intensity determined to obtain alignment information about the mask and wafer.

All of the above alignment devices or sensors have performed adequately for aligning a wafer and mask. While alignment marks on the mask or reticle and the wafer have been used with acceptable results, the ever decreasing feature size or line width being produced on the wafer results in the need for improved alignment sensors. The difficulty of accurate alignment is increased when various processing steps result in multiple layers being formed on the wafer that coat or obscure the alignment marks making their detection difficult with conventional alignment sensors. Producing alignment marks on the mask or reticle of high quality also undesirably adds to the cost of the reticle or mask, and therefore, the overall manufacturing process. There is a need for an improved alignment sensor and alignment method that will improve the alignment between a mask and a wafer and provide better reliability independent of process steps in a variety of applications. Additionally, there is a continuing need to improve alignment sensors in both accuracy and speed, as semiconductor manufacturing technologies advance.

SUMMARY OF THE INVENTION

The present invention uses an interferometer arrangement to determine mask and wafer alignment. An illumination source provides a coherent electromagnetic radiation, which may have multiple discreet wavelengths, to a beamsplitter. The beamsplitter divides the coherent electromagnetic radiation to illuminate at near normal incidence a first fixed or stationary diffraction grating and a second diffraction grating placed on a movable wafer. The diffracted orders from the fixed reference grating are collected, together with the diffracted orders from the movable wafer grating. The motion of the movable wafer grating causes a measurable phase shift. The collected diffraction orders are detected and the phase shift determined. A signal processor calculates any misalignment based on the phase shift and other information, and provides control signals to a stage controlor. Alignment is therefore maintained between the wafer grating and the fixed grating. By other means a mask stage is accurately positioned with respect to the fixed grating. The use of multiple channels containing different diffraction orders and different wavelengths or colors of electromagnetic radiation from the illumination source helps to attain alignment information irrespective of processing variables associated with different layers or coatings on a wafer. By selectively polarizing the illumination source and providing a central polarized portion on the beamsplitter, the different channels or diffraction orders and wavelengths can be balanced for optimum contrast. Alternatively, the contrast can be minimized, suppressing the interference, allowing the alignment sensor to operate in a mode to permit the use of latent image metrology (LIM) methods, by measuring diffracted intensity.

Accordingly, it is an object of the present invention to improve alignment of a wafer and a reticle irrespective of processing variables.

It is a further object of the present invention to provide redundant alignment information.

It is an advantage of the present invention that the phase detection required for determining alignment is relatively simple.

It is a further advantage of the present invention that the expense of providing a grating on a mask or reticle is avoided.

It is a feature of the present invention that it has an interferometer geometry.

It is another feature of the present invention that a fixed grating is used.

It is yet another feature of the present invention that multiple discreet wavelengths may be used to obtain necessary alignment information, irrespective of processing variables.

These and other objects, advantages, and features will become readily apparent in view of the following more detailed description.

BRIEF DESCRIPTION OF THE DRAWINGS

FIG. 3 is a plan view illustrating diffraction orders collected from the diffraction gratings.

FIGS. 4A and 4B schematically illustrates the change in phase of a plane wave due to horizontal displacement of the diffraction grating.

DETAILED DESCRIPTION OF THE PREFERRED EMBODIMENT

Figure 1:
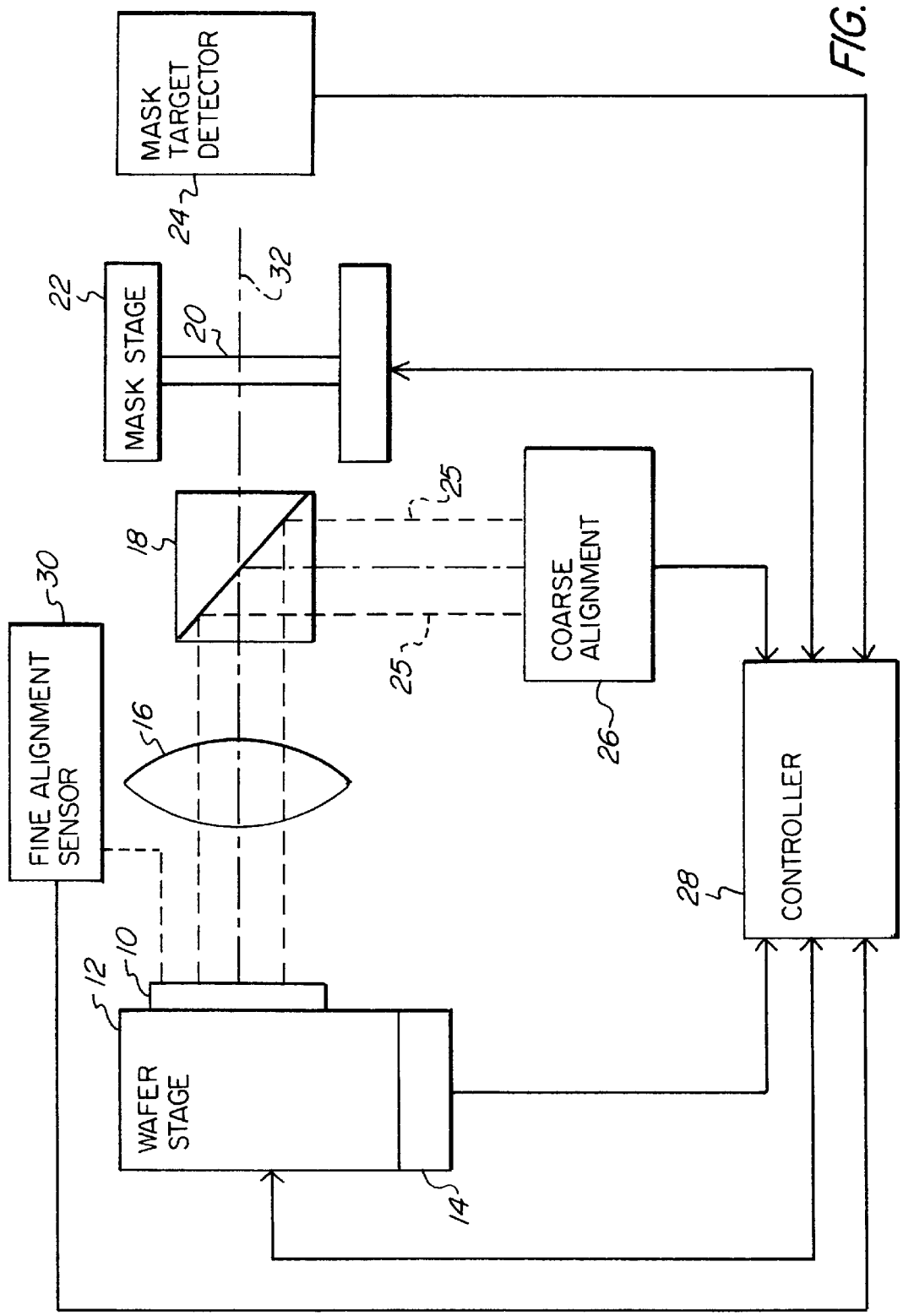
FIG. 1 is a schematic illustration of a portion of a photolithography system utilizing the present invention.

FIG. 1 is a simplified schematic illustration of an alignment system in a photolithography system. A wafer 10 is placed on a wafer stage 12 that is movable in both X-Y directions. Wafer stage 12 has adjacent and attached thereto an auto-calibration detector 14. A mask 20 is attached to mask stage 22. The mask stage 22 typically moves along a single axis in a plane parallel to that of the movement of wafer stage 12. This is typically in the Y direction. Between wafer 10 and mask 20 is positioned projection optics 16. The projection optics 16 image the mask 20 onto portions of the wafer 10. The optical axis of the projection optics 16 is illustrated by dashed line 32. For convenience, the illumination system for imaging the mask 20 onto the wafer 10 is not illustrated. Between the mask 20 and the wafer 10 is a beamsplitter 18. Coarse alignment channels 25 are associated with the beamsplitter 18. The coarse alignment 26 determines the alignment of the wafer to within a relatively large value, for example, several microns. Mask target detector 24 is used to detect targets on the mask and may be used in combination with wafer targets. Because multiple optical alignment channels may be used which are movable to accommodate different field heights, an auto-calibration detector 14 must be mounted on the wafer stage 12 and is used to periodically measure the offsets between the fine alignment sensor light alignment channel paths and the actinic exposure projection optic paths for different channel positions and alignment marks. The alignment information is coupled or provided to controlor 28, which controls the movement of the wafer stage 12 and the mask stage 22, thereby maintaining alignment during scanning of the mask stage and wafer stage. Fine alignment sensor 30, to which the present invention is directed, provides alignment and position information to within less than one micron, thereby providing the fine alignment required in the manufacture of semiconductor devices having small feature sizes. Additionally, the fine alignment sensor 30 provides improved alignment irrespective of processing variables.

Figure 2:
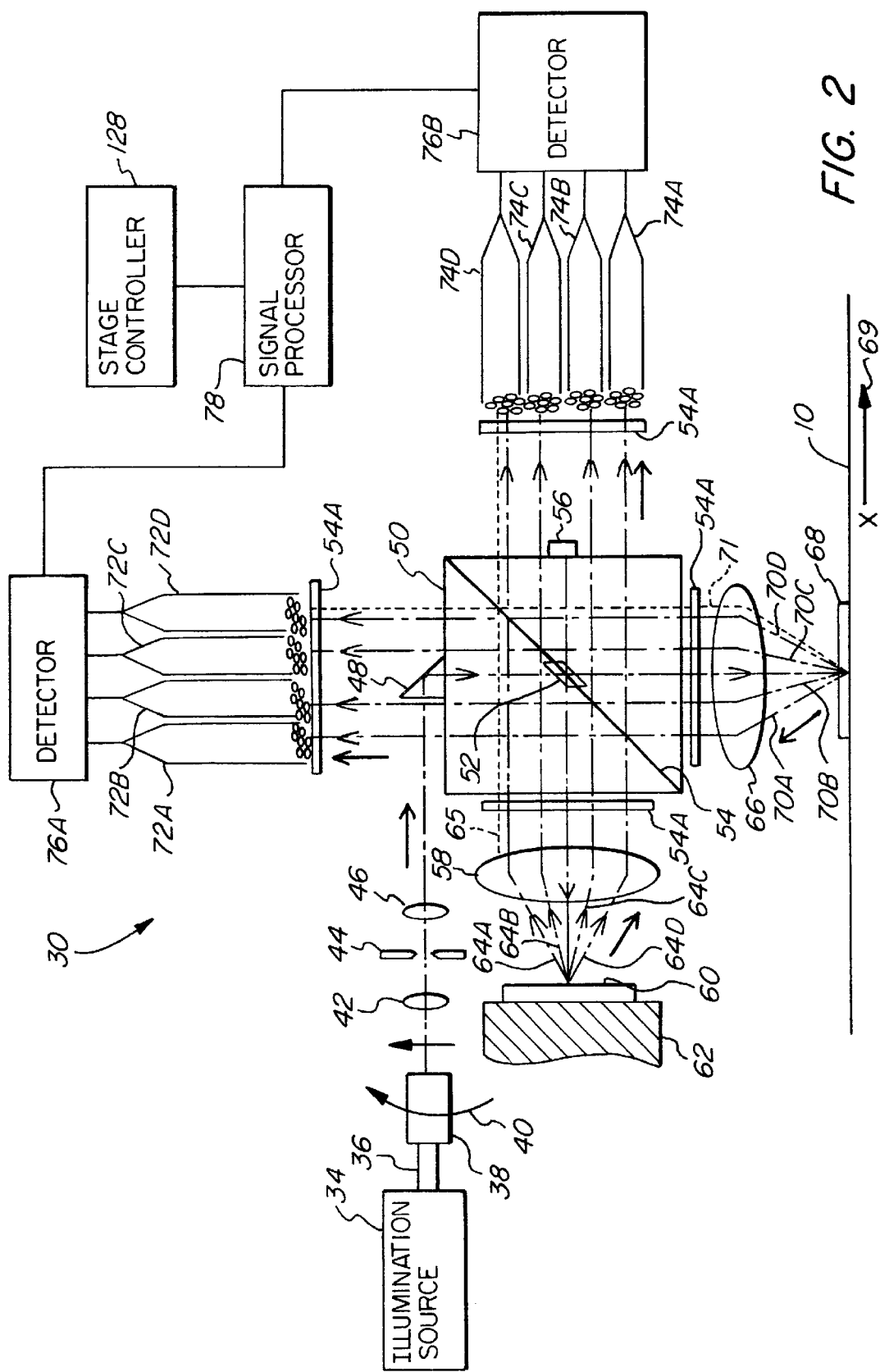
FIG. 2 is a schematic illustration illustrating the alignment sensor of the present invention.

FIG. 2 schematically illustrates the fine alignment sensor 30, illustrated generally in FIG. 1. An alignment illumination source 34 directs electromagnetic radiation to fiber optics 36. The electromagnetic radiation provided by alignment illumination source 34 should be substantially coherent. However, the illumination source 34 may have a plurality of discreet wavelengths. For example, the wavelengths may range between 630 to 870 nanometers and preferably have at least four discreet wavelengths, equally divided between 630 nanometers and 870 nanometers. The fiber optics 36 may be a single mode polarization preserving fibers. At the end of the fiber optics 36 is a polarizing output fixture 38. Arrow 40 represents the rotating of the polarizing output fixture 38. The electromagnetic radiation from the illumination source 34 is directed to a beamsplitter 50 through lenses 42 and 46, and stop 44, and is folded by beam folder 48. The beamsplitter 50 has a coating 54 thereon for effecting the splitting of a beam. The beam of electromagnetic radiation may be split or replicated by use of either an amplitude or polarizing type beamsplitter. Likewise, central portion 52 of the beamsplitter 50 may be split or replicated by use of either an amplitude or polarizing type coating. Up to four waveplates 54A, may be required depending upon the selected method of beam division. Accordingly, the resultant two beams of electromagnetic radiation will have locked mutual phases. Surface 56 absorbs undiffracted light and is placed adjacent one side of the beamsplitter 50. One of the beams of electromagnetic radiation from the beamsplitter 50 illuminates at near normal incidence a fixed reference diffraction grating 60. The fixed reference grating 60 may be any type of grating. The fixed reference grating 60 is attached to a fixed reference 62. The fixed reference 62 is stationary and is at a known stable position with reference to a mask stage, such as that illustrated in FIG. 1. A second beam of electromagnetic radiation from the beamsplitter 50 illuminates a wafer diffraction grating 68 attached to or associated with wafer 10. The wafer grating 68 may be any grating, but is preferably a two-dimensional grating with the same period that has axes orientated forty-five degrees with respect to the direction of motion of wafer 10. The fixed reference grating 60 may be a similar two-dimensional grating. Gratings 60 and 68 should contain gratings with the same period(s) and orientations. The direction of motion of wafer 10 is illustrated by arrow 69. Arrow 69 illustrates motion in the X direction. The first beam or portion of electromagnetic radiation from the beamsplitter 50 illuminating the fixed reference grating 60 results in diffraction orders 64A, 64B, 64C, and 64D being collected by objective lens 58. Lines 64B and 64C represent a first diffraction order, and lines 64A and 64D represent a second diffraction order. While only two orders are shown to be collected by the lens 58, more than two orders may be collected. Dotted line 65 represents a diffraction order from a different wavelength or color of electromagnetic radiation when a multiwavelength illumination source is used. The diffraction orders represented by lines 64A–D enter the beamsplitter 50 and are directed to optical fiber collectors 72A–D and 74A–D. The second beam or portion of electromagnetic radiation illuminating movable wafer grating 68 is diffracted and collected by achromatic objection lens 66, which is similar to objective lens 58, and enters beamsplitter 50. Each diffraction order 70A–D is directed to a respective one of the optical fiber collectors 72A–D. The resultant electromagnetic radiation from optical fiber collectors 72A–72D is collected by detector 76A. Detector 76A converts the electromagnetic radiation into a signal which is input into a signal processor 78. Similarly, the electromagnetic radiation collected by optic fiber collectors 74A–D is detected by detector 76B. Detector 76B converts the electromagnetic radiation into a signal which is input into signal processor 78. While two detectors 76A and 76B are illustrated, detectors 76A and 76B may be detector arrays or incorporated into a single detector. The signal processor 78 converts the respective signals from detector 76A and detector 76B into a signal representative of the displacement or misalignment of wafer grating 68 with reference to fixed reference grating 60. Any misalignment between the movable wafer grating 68 and the fixed reference grating 60, as the wafer 10 is moved or scanned, will result in a phase delay resulting in beats to occur which are processed by the signal processor 78 with well known techniques. Accordingly, the detector 76A and 76B may simply be a multi-element detector for detecting temporal signals occurring on all orders and colors. Therefore, all information for an order is in the phase of the interference beat, clocked to the laser metrology data from the stage scan.

FIG. 3 schematically illustrates a view of the various diffraction orders at a pupil 80. From the plan view of pupil 80, the diffraction orders are created by the two dimensional movable grating 68, illustrated in FIG. 2. Circles 82 represent the first diffraction order as a result of one dimension of the two dimensional grating for a particular color or wavelength. Circles 82A represent the first diffraction order as a result of one dimension of the two dimensional grating for another second color or wavelength. Circles 84 represent a second diffraction order for the one dimension of the two dimensional grating at the first wavelength or color. Circles 84A represent a second diffraction order as a result of the one dimension of the two dimensional grating at the second wavelength or color. Similarly, circles 86 represent a first diffraction order as a result of the other dimension of the two dimensional grating for a second grating, orthogonal to the first grating, for the first wavelength or color. Circles 86A represent the first diffraction order as a result of the other dimension of the two dimensional grating for a second wavelength or color. Circles 88 represent a second diffraction order as a result of the other dimension of the two dimensional grating for the first wavelength or color. Circles 88A represent a second diffraction order as a result of the other dimension of the two dimensional grating for the second grating for a second wavelength or color. The first and second gratings are preferably perpendicular to each other and positioned at a forty-five degree angle relative to the direction of scan or movement. A great deal of information is available in the amplitude and phase of the diffracted orders of a grating. While only two orders have been illustrated, clearly more than two orders may be collected. While only orders for two different colors or wavelengths have been illustrated, clearly more may be used, and preferably at least four discreet wavelengths or colors of electromagnetic radiation are utilized.

FIGS. 4A and 4B graphically illustrate the phase change or shift as a result of movement of the wafer grating relative to the fixed grating. Substantially coherent illumination illuminates the grating 168, resulting in diffracted electromagnetic radiation propagating in a direction θ degrees from the illumination beam 90. Arrow 94 illustrates the propagation direction of the plane waves 92 as a result of the diffraction of the illumination beam 90. FIG. 4B illustrates the resulting change of phase as a result of a horizontal shift of the grating 168 along the X axes, with respect to FIG. 4A. FIG. 4B illustrates the grating 168 being shifted approximately one-quarter of a period P indicated as Δ X. As a result, a shifted or delayed plane wave 96 results, resulting in a phase shift Δ φ from the original plane wave position 92. Accordingly, this phase shift can be detected and measured which directly relates to the horizontal positioning and alignment of the grating 168 and correspondingly, a wafer which is attached to the grating 168.

Figure 5:
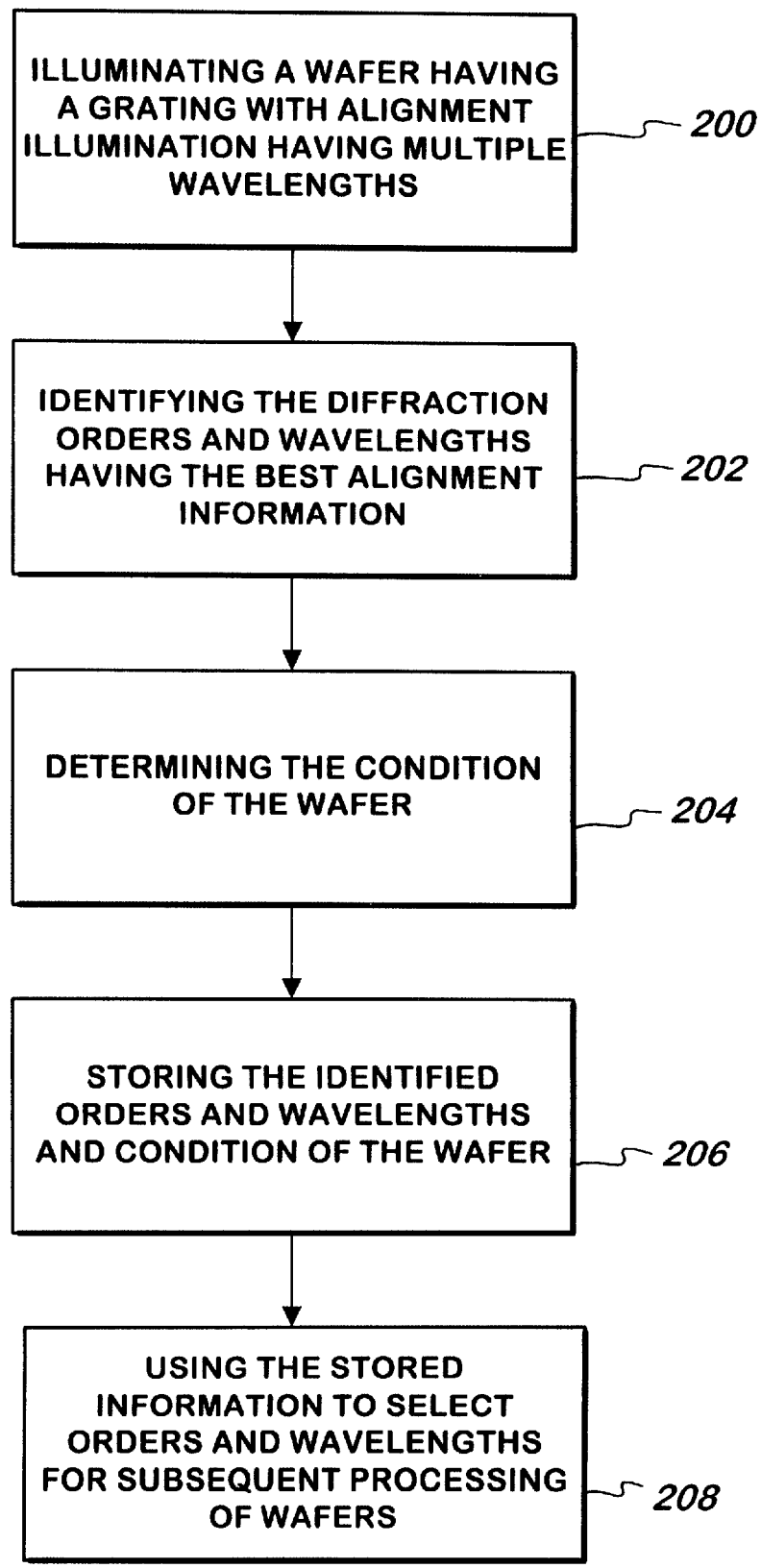
FIG. 5 is a block diagram illustrating a method to increase production efficiencies in aligning a mask and wafer.

FIG. 5 is a block diagram illustrating a preferred method or process of practicing the present invention in a learning mode to achieve optimized alignment, irrespective of process variables such as asymmetries or coatings on the wafer grating due to the processing of a wafer during the manufacture of a device. In FIG. 5, block 200 represents the act or step of illuminating a first wafer having a grating thereon with alignment illumination having multiple discrete wavelengths. The discrete wavelengths may be at least four and range between six hundred and thirty and eight hundred and seventy nanometers. Block 202 represents the act or step of identifying the diffraction orders and wavelengths having the best alignment information. In determining the best alignment information the strongest signals may be used or a combination of signal strength and prior information relating to expected diffraction orders or wavelengths may be considered. Accordingly, optimization of the detection of the best alignment information is determined by selecting both the color or wavelength and diffraction order that provides the best indication of alignment in view of the processing variables. For example, some colors or wavelengths may provide a better signal depending upon metal grain noise, and other interference or edge effects. Block 204 represents the act or step of determining the condition of the wafer. Block 206 represents the act or step of storing the identified orders, and wavelengths, and condition of the wafer due to the processing variables. Block 208 represents the act or step of using the stored information to select identified orders and wavelengths used in subsequent wafer processing on wafers having similar conditions or processing variables.

The above process steps or method makes it possible for the system to learn or optimize the alignment procedure by looking for specific wavelengths or colors and diffraction orders that provide the most reliable information irrespective of wafer processing variables for obtaining the most accurate alignment. Accordingly, as a result of the apparatus and method of the present invention, alignment of wafers with a mask or reticle is enhanced, improving alignment accuracy and throughput.

The operation of the present invention can readily be appreciated with reference to FIGS. 1–5. With reference to FIG. 1, the course alignment 26 is able to detect alignment between the wafer 10 and mask 20 to within a period of the wafer gratings 60 and 68, illustrated in FIG. 2. The period of the wafer gratings 60 and 68, illustrated in FIG. 2, should be in the range of one to five microns and is preferably 2.5 microns. Accordingly, the fine alignment sensor 30, illustrated in FIG. 1 and FIG. 2, is utilized to achieve an alignment accuracy substantially less than 2.5 microns, and in the order of one nanometer. This alignment accuracy is achieved by utilizing a relatively consistent and accurate reference grating 60 that may be made very precisely and that has the same period as a movable grating 68 placed on a wafer to be aligned with a reticle or mask. Any misalignment of the movable wafer grating 68 with respect to the reference grating 60 and a coarse alignment position is detected as a phase shift from a reference signal. This phase shift is utilized by the signal processor 78, illustrated in FIG. 2, to provide misalignment information to a stage controller 128. The stage control 128 causes the wafer stage 12 and the mask stage 22, illustrated in FIG. 1, to move accordingly so as to maintain alignment. The movement of the mask stage 22 is generally referenced to a distance from the fixed reference 62 on which the reference grating 60 is mounted and a coarse alignment position as determined by coarse alignment 26, illustrated in FIG. 1.

The present invention also has the advantage that it may be easily converted to a latent image metrology (LIM) mode by eliminating the phase measurement aspect. This is made possible by the use of the polarizing output fixture 38 and the central polarizing portion 52 of beamsplitter 50. By rotating the polarizing output fixture 38, the electromagnetic radiation provided to the fixed reference grating 60 can be reduced and/or eliminated. This has the advantage of transforming by command the present invention into a latent image metrology sensor. Latent image metrology is a known diagnostic that is desirable in some applications for reducing various critical dimension errors, asymmetries, and aberrations by comparing various order intensities for various latent grating images. Therefore, in some applications, the ability to convert an alignment sensor into a latent image metrology sensor is advantageous.

The reference phase in the alignment sensor of the present invention comes from the fixed grating 60. For each order and wavelength, the objective lens 58 collimates a coherent, monochromatic beam from the reference grating 60. Any of these reference orders is phase locked to a beam of the same wavelength created by the beamsplitter 50. These beams probe the wafer grating 68 and diffract in an identical geometry. As the wafer 10 is scanned in the X direction, phase delay will vary and interference beats will occur. With the use of lossless coatings 54, because of conservation of energy, the beats in orthogonal beams of the same diffracted order must be complimentary and so there is always light or electromagnetic radiation being detected somewhere. As with any interferometer, the phase is arbitrary, but the differences are significant. The alignment sensor measures the phase difference with the use of course alignment to remove any ambiguity because of the modulo two-pi error, or shift of one whole wavelength. An advantage of the present invention is that the reference grating 60 always has the same predictable diffraction efficiencies. However, the wafer grating 68 has losses and redistribution of efficiencies among the orders. In some applications, it may be useful to balance the reference amplitude for highest fringe contrast. To provide this balancing ability with no phase change, the central part 52 of the beamsplitter 50 may be polarized, while the rest of the beamsplitter 50 is an amplitude splitting coating. Accordingly, by rotating polarization output fixture 38, a balance can be achieved without any unnecessary light loss. This is accomplished by twisting the polarizing output fixture 38 associated with the illuminated source 34. Additionally, the polarizing output fixture 38 can be used to bring the amplitude down to zero, effectively creating the latent image metrology mode previously discussed.

Accordingly, the present invention has many advantages in improving the alignment between a mask and wafer used in photolithography for the manufacture of semiconductors. The use of a fixed reference grating makes it unnecessary to place a high quality grating on each mask or reticle used. A separate and distinct mask alignment mark is allowed. In addition, the alignment sensor of the present invention can easily be converted for latent image metrology use. Additionally, the use of multiple wavelengths is made possible resulting in a method of optimizing detection and alignment in accordance with various processing variables and asymmetries, thereby enhancing throughput.

Although the preferred embodiments have been illustrated and described, it will be obvious to those skilled in the art that various modifications may be made without departing from the spirit and scope of this invention.

What is claimed is:

1. An alignment sensor comprising:

an illumination source;

a polarizing output fixture coupled to said illumination source;

a beamsplitter, said beamsplitter receiving electromagnetic radiation from said illumination source through said polarizing output fixture;

a central polarizing portion on said beamsplitter;

a fixed grating positioned to receive a first portion of the electromagnetic radiation from said beamsplitter;

a movable grating positioned to receive a second portion of the electromagnetic radiation from said beamsplitter;

a detector positioned adjacent said beamsplitter receiving electromagnetic radiation diffracted from said fixed grating and said movable grating; and a signal processor coupled to said detector, whereby the relative alignment between said fixed grating and said movable grating is detected and electromagnetic radiation provided to said fixed grating is capable of being reduced.

2. An alignment sensor as in claim 1 wherein:

the illumination source is comprised of a plurality of discrete wavelengths.

3. An alignment sensor as in claim 2 wherein:

the plurality of discrete wavelengths comprises four.

4. An alignment sensor as in claim 1 wherein:

said fixed grating and said movable grating are two dimensional gratings.

5. An alignment sensor as in claim 1 wherein:

said beamsplitter is a polarizing beamsplitter.

6. An alignment sensor as in claim 1 wherein:

said beamsplitter is an amplitude splitting beamsplitter.

7. An alignment sensor as in claim 1 wherein:
said fixed grating and said movable grating have the same period.

8. An alignment sensor as in claim 7 wherein:
the period is between 1 and 5 microns.

9. An alignment sensor comprising:
a fixed reference;
a mask stage, said mask stage capable of moving in relation to said fixed reference;
a wafer stage, said wafer stage capable of moving in relation to said fixed reference;
a beamsplitter, said beamsplitter receiving electromagnetic radiation from a substantially coherent illumination source comprised of a plurality of discrete wavelengths;
a fixed grating attached to said fixed reference and positioned to receive a first portion of the electromagnetic radiation from said beamsplitter;
a movable grating attached to a wafer placed on said wafer stage and positioned to receive a second portion of the electromagnetic radiation from said beamsplitter;
a detector positioned adjacent said beamsplitter receiving electromagnetic radiation diffracted from said fixed grating and said movable grating;
a signal processor coupled to said detector, said signal processor identifying a phase difference, whereby the relative alignment between said fixed grating and said movable grating is detected;
storage means, associated with said signal processor, for storing information identifying diffraction orders, the plurality of discrete wavelengths, and wafer condition for optimized detection of alignment of said fixed grating and said movable grating;
selection means, associated with said storage means, for selecting from the information in said storage means to optimize detection of alignment depending upon wafer conditions; and
a stage control, coupled to said signal processor and said mask stage and said wafer stage, said stage control controlling the relative position of said mask stage and said wafer stage,
whereby alignment between said mask stage and said wafer stage is maintained.

10. An alignment sensor as in claim 9 wherein:
said fixed grating and said movable grating are two dimensional gratings.

11. A transformable alignment sensor comprising:
a substantially coherent illumination source having a plurality of discrete wavelengths;
a polarization output fixture associated with said coherent illumination source, whereby the polarization of the electromagnetic radiation from said coherent illumination source is selectively controlled;
a fixed reference;
a mask stage, said mask stage capable of moving in relation to said fixed reference;
a wafer stage, said wafer stage capable of moving in relation to said fixed reference;
a beamsplitter, said beamsplitter receiving electromagnetic radiation from said substantially coherent illumination source;
a polarization coating placed on a central portion of said beamsplitter;
a fixed grating attached to said fixed reference and positioned to receive a first portion of the electromagnetic radiation from said beamsplitter;
a movable grating attached to a wafer placed on said wafer stage and positioned to receive a second portion of the electromagnetic radiation from said beamsplitter;
a detector positioned adjacent said beamsplitter receiving electromagnetic radiation diffracted from said fixed grating and said movable grating;
a signal processor coupled to said detector, said signal processor detecting a phase difference, whereby the relative alignment between said fixed grating and said movable grating is detected; and
a stage control, coupled to said signal processor and said mask stage and said wafer stage, said stage control controlling the relative position of said mask stage and said wafer stage,
whereby alignment between said mask stage and said wafer stage is maintained.

12. An alignment sensor as in claim 11 wherein:
said fixed grating and said movable grating are two dimensional gratings.

13. A method of aligning a mask and wafer in photolithography comprising the steps of:
illuminating a wafer having a wafer grating with alignment illumination having multiple discrete wavelengths;
illuminating a fixed grating with the alignment illumination having multiple discrete wavelengths;
identifying the diffraction orders and wavelengths providing optimized alignment information from electromagnetic radiation diffracted from the wafer grating and fixed grating;
determining the condition of the wafer;
storing information about the identified diffraction orders and wavelengths and the condition of the wafer; and
using the stored information to select diffraction orders and wavelengths to utilize in subsequent wafer processing under similar wafer conditions,
whereby alignment required in subsequent wafer processing may be substantially improved.

14. A method as in claim 13 wherein:
the multiple discrete wavelengths comprise four.

15. A method as in claim 13 wherein:
the multiple discrete wavelengths range between 780 and 870 nanometers.

16. A method of optimizing detection of alignment information for aligning a mask and wafer for use in photolithography comprising the steps of:
illuminating a wafer grating with alignment illumination having a plurality of discrete wavelengths;
illuminating a reference grating with the alignment illumination having the plurality of discrete wavelengths;
collecting a plurality of diffraction orders diffracted from the wafer grating and the reference grating for each of the plurality of discrete wavelengths;
identifying diffraction orders from the plurality of diffraction orders and wavelengths from the plurality of wavelengths for providing optimized alignment information from the alignment illumination diffracted from the wafer grating and the reference grating, whereby the best alignment information is determined in view of wafer processing variables; and
using the identified diffraction orders and wavelengths determined in said step of identifying for detecting a phase shift in the alignment illumination diffracted from the wafer grating and the reference grating, whereby alignment of the wafer grating and the reference grating is capable of being accurately determined irrespective of wafer processing variables.

17. A method of optimizing detection of alignment information for aligning a mask and wafer for use in photolithography as in claim 16 further comprising the step of:

reducing the electromagnetic radiation provided to the reference grating, whereby highest contrast is capable of being achieved.

18. An apparatus for optimizing detection of alignment information for aligning a mask and wafer for use in photolithography comprising:

a wafer grating connected to a wafer;

a reference grating;

an illumination source, said illumination source illuminating said wafer grating and said reference grating with alignment illumination having a plurality of discrete wavelengths;

a detector, said detector collecting a plurality of diffraction orders diffracted from said wafer grating and said reference grating for each of the plurality of discrete wavelengths; and a signal processor coupled to said detector, said signal processor identifying selected diffraction orders from the plurality of diffraction orders and selected wavelengths from the plurality of wavelengths, the selected diffraction orders and the selected wavelengths capable of providing optimized alignment information from the alignment illumination diffracted from said wafer grating and said reference grating so that optimized alignment information is determined in view of processing variables and determining a phase shift in electromagnetic radiation of the selected diffraction orders and the selected wavelengths collected from said wafer grating and said reference grating, whereby alignment of the wafer grating and the reference grating is capable of being accurately determined irrespective of wafer processing variables.

19. An apparatus for optimizing detection of alignment information for aligning a mask and wafer for use in photolithography as in claim 18 further comprising:

an amplitude beamsplitter directing a portion of the alignment illumination to said wafer grating and another portion of the alignment illumination to said reference grating;

a polarizing portion formed at the center of said amplitude beamsplitter polarizing the alignment illumination;

a polarizing output fixture positioned between said illumination source and said amplitude beamsplitter, said polarizing output fixture selectively polarizing the alignment illumination, whereby the alignment illumination provided to the reference grating is capable of being reduced.

\* \* \* \* \*